(12) United States Patent
Hogervorst et al.

(10) Patent No.: US 12,301,122 B2
(45) Date of Patent: May 13, 2025

(54) ISOLATED GATE DRIVER

(71) Applicant: Murata Manufacturing Co., Ltd., Nagaokakyo (JP)

(72) Inventors: Ronald Hogervorst, Grasse (FR); Joseph Duigan, Grasse (FR); Karl Rinne, Grasse (FR)

(73) Assignee: MURATA MANUFACTURING CO., LTD., Kyoto (JP)

( * ) Notice: Subject to any disclaimer, the term of this patent is extended or adjusted under 35 U.S.C. 154(b) by 399 days.

(21) Appl. No.: 17/918,314

(22) PCT Filed: Apr. 16, 2021

(86) PCT No.: PCT/US2021/027600
§ 371 (c)(1),
(2) Date: Oct. 11, 2022

(87) PCT Pub. No.: WO2021/211920
PCT Pub. Date: Oct. 21, 2021

(65) Prior Publication Data
US 2023/0137936 A1    May 4, 2023

Related U.S. Application Data

(60) Provisional application No. 63/011,735, filed on Apr. 17, 2020.

(51) Int. Cl.
*H02M 1/08* (2006.01)
*H02M 3/335* (2006.01)
(Continued)

(52) U.S. Cl.
CPC ......... *H02M 3/33592* (2013.01); *H02M 1/08* (2013.01); *H02M 7/217* (2013.01);
(Continued)

(58) Field of Classification Search
CPC .... H02M 3/33592; H02M 1/08; H02M 7/217; H02M 1/0045; H02M 1/123;
(Continued)

(56) References Cited

U.S. PATENT DOCUMENTS 6,343,023 B1    1/2002  Wunderlich
8,526,206 B2 *  9/2013  Fotherby .............. H03K 17/691
                                                    327/424
(Continued)

FOREIGN PATENT DOCUMENTS

WO    2009008739 A1    1/2009

OTHER PUBLICATIONS

Extended European Search Report in EP21789451.8, mailed Mar. 13, 2024, 9 pages.
(Continued)

*Primary Examiner* — Elim Ortiz
*Assistant Examiner* — Xuan Ly
(74) *Attorney, Agent, or Firm* — Keating & Bennett, LLP

(57) ABSTRACT

An isolated gate driver includes a transformer including primary and secondary windings, a synchronous rectifier connected between the secondary winding and an output terminal of the isolated gate driver, a first switch including a first terminal connected to a supply voltage, a second switch including a first terminal connected to the supply voltage, a first damping resistance connected between a first terminal of the secondary winding and a second terminal of the first switch, a second damping resistance connected between a second terminal of the secondary winding and a second terminal of the second switch, a first inverter including an input connected to the first terminal of the secondary winding and an output connected to a gate terminal of the first switch, and a second inverter including an input con-
(Continued)

nected to the second terminal of the secondary winding and an output connected to a gate terminal of the second switch.

13 Claims, 5 Drawing Sheets

(51) Int. Cl.
    *H02M 7/217*     (2006.01)
    *H03K 17/0412*     (2006.01)

(52) U.S. Cl.
    CPC .................. *H03K 17/04123* (2013.01); *H03K 2217/0081* (2013.01)

(58) Field of Classification Search
    CPC .... H02M 1/344; H02M 1/0006; H02M 3/335; H03K 17/04123; H03K 2217/0081; H03K 17/691; H03K 17/0424; H03K 17/0812; H03K 17/0412; Y02B 70/10
    USPC ........................................................ 307/108
    See application file for complete search history.

(56) References Cited

U.S. PATENT DOCUMENTS

| | | | |
|---|---|---|---|
| 10,014,798 | B1 | 7/2018 | Vinciarelli |
| 2011/0019454 | A1 | 1/2011 | Fotherby |
| 2013/0181748 | A1 | 7/2013 | Zajc |
| 2019/0341847 | A1 | 11/2019 | Yuzurihara et al. |

OTHER PUBLICATIONS

Official Communication issued in International Patent Application No. PCT/US2021/027600, mailed on Aug. 6, 2021.

* cited by examiner

ISOLATED GATE DRIVER

BACKGROUND OF THE INVENTION

1. Field of the Invention

The present invention relates to isolated gate drivers. More specifically, the present invention relates to circuitry that manages impedance and leakage inductance in transformer-based isolated gate drivers.

2. Description of the Related Art

Floating gate drivers, which are isolated gate drivers, include components of an isolated DC-DC converter and an isolator that separately transfer data from a primary side of a transformer to a secondary side of the transformer of the DC-DC converter. However, known floating gate drivers require many components to transfer both power and data, as power and data are separately transferred. In addition, it is difficult to transfer an isolated signal and isolated power at high frequencies when using a single component.

In the conventional floating gate driver shown in FIG. 1, a transformer with primary and secondary windings divides the conventional floating gate driver into a primary side with circuitry connected to the primary winding Lprim and a secondary side with circuitry connected to the secondary winding Lsec. A positive signal at terminal TXPP and a negative signal at terminal TXPN input on the primary side of the transformer is rectified by a synchronous rectifier, including switches S1, S2, MC1, MC2, and provides output power as indicated by an output voltage VSEC across capacitor CSEC. When a positive signal is input at terminal TXPP, a first buffer BUF1 is triggered when the first buffer BUF1 detects a voltage above a threshold level to provide a data signal indicating that a positive signal was received on the primary side of the transformer. When a negative signal is input at terminal TXPN, a second buffer BUF2 is triggered when the second buffer BUF2 detects a voltage above a threshold level to provide a data signal indicating that a negative signal was received on the primary side of the transformer. That is, the first buffer BUF1 and the second buffer BUF2 may provide output data signals that mimic, or are similar to, drive signals.

The switches MC1 and MC2 are used to connect the lines TXSP, TXSN to the supply voltage VSUP-, which can be a reference voltage or ground. When a positive signal is input at terminal TXPP, the switch MC1 connects the line TXSN to the supply voltage VSUP-. When a negative signal is input at terminal TXPN, the switch MC2 connects the line TXSP to the supply voltage VSUP-. Switching which of lines TXSP, TXSN is connected to the supply voltage VSUP- allows power to be transferred to the capacitor CSEC. The output power may be used to drive, for example, a gang chip (not shown).

The conventional floating gate driver shown in FIG. 1 also includes common-mode setting resistors RCM1, RCM2. The common-mode setting resistors RCM1, RCM2 preferably have relatively high resistance values in order to reduce power consumption (for example, about 100 kΩ). For example, the common-mode setting resistors RCM1, RCM2 may have the same or substantially the same resistance value.

However, as shown in FIG. 2, the conventional floating gate driver is susceptible to ringing, which can cause undesired changes in the state of the gate driver. For example, when an input signal goes high (e.g., a positive signal input on the primary side of the transformer), a pulse is provided on terminal TXPP. The primary winding Lprim on the primary side of the transformer induces a voltage on the secondary winding Lsec on the secondary side of the transformer at line TXSP, which switches on switch MC1 and charges capacitor CSEC.

When the input signal goes low and no pulse is provided at terminal TXPP, the voltage across the primary winding Lprim on the primary side of the transformer goes to zero. However, since energy is stored as a leakage inductance Llk of the transformer, ringing due to resonance may occur. More specifically, current from the leakage inductance Llk of the transformer will continue to flow until the diode of switch S1 is blocked, which causes line TXSN to quickly lower in voltage while line TXSN increases in voltage. The leakage inductance Llk of the transformer then passes through zero volts and reverses polarity, and the resonance process described above repeats.

During the above-described resonance process, line TXSN may reach a sufficiently high voltage to cause the second buffer BUF2 to be triggered, thereby causing the floating gate driver to incorrectly provide a data signal indicating that a negative signal was received, thereby causing an undesired state change of the gate driver.

To reduce the resonance process described above with respect to FIG. 2, a resistor Rdamp may be added between the lines TXSP and TXSN as shown in FIG. 3. The resistor Rdamp dissipates energy that is built up in the leakage inductance Llk of the transformer, thereby reducing the occurrence of ringing on the secondary side of the transformer. Preferably the resistance of the resistor Rdamp is relatively small (for example, about 200Ω or less) in order to effectively dissipate the energy of higher leakage inductances. However, since the resistor Rdamp also dissipates energy at the secondary side of the transformer that has been inducted by the input signal at the primary side of the transformer, an overall efficiency of transferring energy to the capacitor CSEC is reduced.

SUMMARY OF THE INVENTION

To overcome the problems described above, preferred embodiments of the present invention provide floating gate drivers that each efficiently transfers isolated power and isolated signals while also significantly reducing or preventing ringing. In addition, preferred embodiments of the present invention are able to provide the functions of power supply and gate driving in a single module, thereby reducing cost and overall size of circuitry included in the floating gate driver and related components.

According to a preferred embodiment of the present invention, an isolated gate driver includes a transformer including a primary winding and a secondary winding, a synchronous rectifier electrically connected between the secondary winding and an output terminal of the isolated gate driver, a first switch including a first terminal electrically connected to a supply voltage, a second switch including a first terminal electrically connected to the supply voltage, a first damping resistance electrically connected between a first terminal of the secondary winding and a second terminal of the first switch, a second damping resistance electrically connected between a second terminal of the secondary winding and a second terminal of the second switch, a first inverter including an input electrically connected to the first terminal of the secondary winding and an output electrically connected to a gate terminal of the first switch, and a second inverter including an input electrically connected to the second terminal of the secondary winding and an output electrically connected to a gate terminal of the second switch.

A first buffer may be electrically connected to the first terminal of the secondary winding, and a second buffer electrically may be connected to the second terminal of the secondary winding.

The isolated gate driver may include a first filter circuit that electrically connects the first terminal of the secondary winding to a first buffer and a second filter circuit that electrically connects the second terminal of the secondary winding to a second buffer. The first filter circuit may include a first filtering resistance electrically connected in series between the first terminal of the secondary winding and an input of the first buffer and a first filtering capacitance electrically connected between the input of the first buffer and the supply voltage. The second filter circuit may include a second filtering resistance electrically connected in series between the second terminal of the secondary winding and an input of the second buffer and a second filtering capacitance electrically connected between the input of the second buffer and the supply voltage. The first filter circuit may include a first delay cell, a first AND-gate, and the first buffer; the first delay cell may be electrically connected in series between the first terminal of the secondary winding and a first input of the first AND-gate; a second input of the first AND-gate may be electrically connected to the first terminal of the secondary winding; and an output of the first AND-gate may be electrically connected to the first buffer. The second filter circuit may include a second delay cell, a second AND-gate, and the second first buffer; the second delay cell may be electrically connected in series between the second terminal of the secondary winding and a first input of the first AND-gate; and a second input of the second AND-gate may be electrically connected to the second terminal of the secondary winding. An output of the second AND-gate may be electrically connected to the second buffer.

According to a preferred embodiment of the present invention, an isolated gate driver includes a transformer including a primary winding and a secondary winding, a synchronous rectifier that provides power at a power output terminal of the isolated gate driver by rectifying high and low voltages provided by a first terminal of the secondary winding and high and low voltages provided by a second terminal of the secondary winding, a buffer circuit that provides data signals at signal output terminals of the isolated gate driver based on the high and low voltages provided by the first terminal of the secondary winding and based on the high and low voltages provided by the second terminal of the secondary winding, and an adjustable-damping circuit that increases an amount of damping provided on the first terminal of the secondary winding when the first terminal of the secondary winding provides the low voltage and that increases an amount of damping provided on the second terminal of the secondary winding when the second terminal of the secondary winding provides the low voltage.

The adjustable-damping circuit can increase the amount of damping provided on the first terminal of the secondary winding by connecting the first terminal of the secondary winding to a supply voltage through a first damping resistance, and the adjustable-damping circuit can increase the amount of damping provided on the second terminal of the secondary winding by connecting the second terminal of the secondary winding to the supply voltage through a second damping resistance.

The adjustable-damping circuit can include a first switch including a first terminal electrically connected to a supply voltage, a second switch including a first terminal electrically connected to the supply voltage, a first damping resistance electrically connected between the first terminal of the secondary winding and a second terminal of the first switch, a second damping resistance electrically connected between the second terminal of the secondary winding and a second terminal of the second switch, a first inverter including an input electrically connected to the first terminal of the secondary winding and an output electrically connected to a gate terminal of the first switch, and a second inverter including an input electrically connected to the second terminal of the secondary winding and an output electrically connected to a gate terminal of the second switch.

The buffer circuit can include a first buffer electrically connected to the first terminal of the secondary winding and a second buffer electrically connected to the second terminal of the secondary winding. The isolated gate driver can further include a filter circuit connected between the secondary winding and the buffer circuit. The filter circuit can include a first filter circuit that electrically connects the first terminal of the secondary winding to a first buffer and a second filter circuit that electrically connects the second terminal of the secondary winding to a second buffer.

The first filter circuit can include a first filtering resistance electrically connected in series between the first terminal of the secondary winding and an input of the first buffer and a first filtering capacitance electrically connected between the input of the first buffer and the supply voltage, and the second filter circuit can include a second filtering resistance electrically connected in series between the second terminal of the secondary winding and an input of the second buffer and a second filtering capacitance electrically connected between the input of the second buffer and the supply voltage.

The first filter circuit can include a first delay cell, a first AND-gate, and the first buffer; the first delay cell can be electrically connected in series between the first terminal of the secondary winding and a first input of the first AND-gate; a second input of the first AND-gate can be electrically connected to the first terminal of the secondary winding; and an output of the first AND-gate can electrically connected to the first buffer. The second filter circuit can include a second delay cell, a second AND-gate, and the second buffer; the second delay cell can be electrically connected in series between the second terminal of the secondary winding and a first input of the first AND-gate; a second input of the second AND-gate can be electrically connected to the second terminal of the secondary winding; and an output of the second AND-gate can be electrically connected to the second buffer.

The above and other features, elements, steps, configurations, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
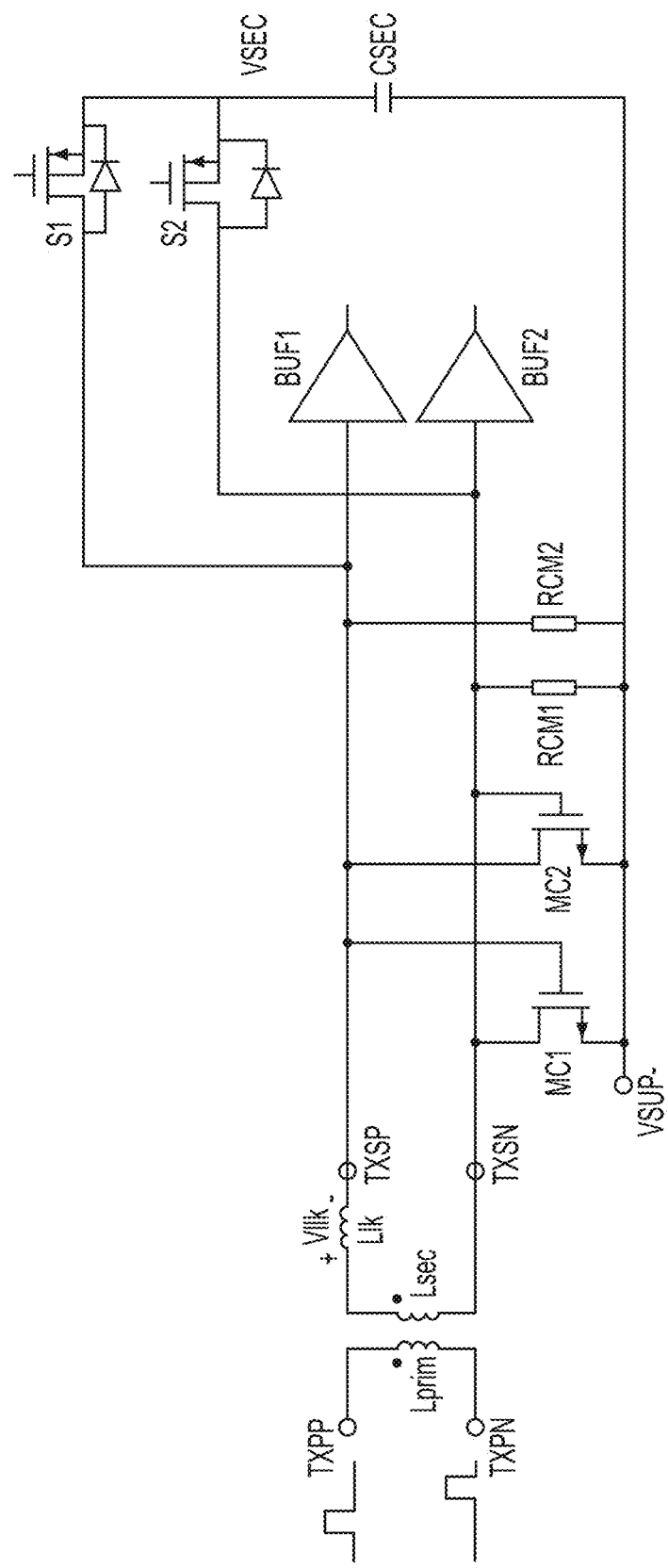
FIG. 1 is a circuit diagram of a conventional floating gate driver.

Preferred embodiments of the present invention will now be described in detail with reference to FIGS. 4 and 5. Note that the following description is in all aspects illustrative and not restrictive and should not be construed to restrict the applications or uses of preferred embodiments of the present invention in any manner. Components in FIGS. 1 and 3 and components in FIGS. 4 and 5 with the same reference numbers have the same or similar functions.

Figure 4:
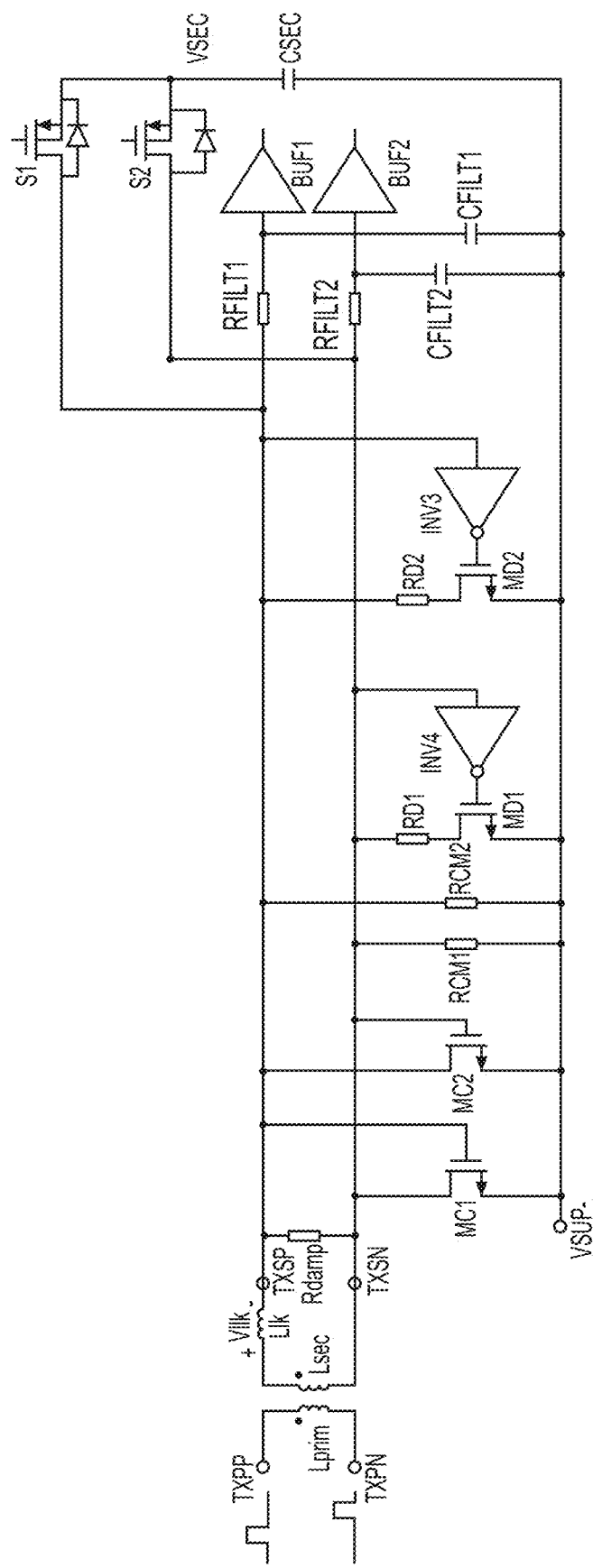
FIG. 4 is a circuit diagram of a floating gate driver according to a first preferred embodiment of the present invention.

FIG. 4 is a circuit diagram of a floating gate driver according to a first preferred embodiment of the present invention. As shown in FIG. 4, damping resistances RD1 and RD2, switches MD1 and MD2, and inverters INV3 and INV4 are included in the floating gate driver.

The floating gate driver includes a transformer with a primary winding Lprim and a secondary winding Lsec that divide the floating gate driver into a primary side with circuitry connected to the primary winding Lprim and into a secondary side with circuitry connected to the secondary winding Lsec.

On the primary side, terminals TXPP, TXPN are connected to the primary windings. High and low voltages, e.g., positive and negative voltages, can be applied to the terminals TXPP, TXPN. As explained below, the high and low voltages can be included in voltage pulses that indicate that an edge, i.e., a transition from a low voltage to a high voltage or a transition from a high voltage to a low voltage, of a control signal is detected.

On the secondary side, terminals TXSP, TXSN are connected to the secondary windings. The leakage inductance Llk is shown connected between the secondary winding Lsec and the terminal TXSP, and a resistor Rdamp is connected between the terminals TXSP, TXSN.

A synchronous rectifier, including switches S1, S2, MC1, MC2, is connected to the terminals TXSP, TXSN and is connected to the capacitor CSEC at the output voltage VSEC. The floating gate driver provides output power at the output voltage VSEC. The switches S1, S2, MC1, MC2 can each include three terminals, with one of the three terminals being a control terminal and the other two terminals providing a channel in which current can flow. The control terminal of switch MC1 is connected to the terminal TXSP, and the other two terminals of switch MC1 are connected across terminal TXSN and the voltage supply VSUP-. The control terminal of switch MC2 is connected to the terminal TXSN, and the other two terminals of switch MC2 are connected across terminal TXSP and the voltage supply VSUP-. The control terminal of switch S1 is connected to a controller (not shown), and the other two terminals of switch S1 are connected across terminal TXSP and the output voltage VSEC. The control terminal of switch S2 is connected to the controller (not shown), and the other two terminals of switch S2 are connected across terminal TXSN and the output voltage VSEC.

A common-mode setting circuit can include common-mode setting resistor RCM1 connected between the terminal TXSN and the supply voltage VSUP- and the common-mode setting resistor RCM2 connected between the terminal TXSP and the supply voltage VSUP-.

A buffer circuit can be connected to the terminals TXSP, TXSN. The buffer circuit can include a first buffer BUF1 and a second buffer BUF2. The first buffer BUF1 can be connected to the terminal TXSP, and the second buffer BUF2 can be connected to the terminal TXSN. The floating gate driver can provide signals at the outputs of the buffer circuit based on the signals at the terminals TXSP, TXSN, which are based on the signals applied to the terminals TXPP, TXPN.

A filter circuit can be connected between the terminals TXSP, TXSN and the buffer circuit. The filter circuit can include a first filter connected to the first buffer BUF1, and a second filter circuit can include a second filter connected to the second buffer BUF2. The first filter can include the filtering resistance RFILT1 connected between the terminal TXSP and an input of the first buffer BUF1 and can include the filtering capacitance CFILT1 connected between the input of the first buffer BUF1 and the supply voltage VSUP-, and the second filter can include the filtering resistance RFILT2 connected between the terminal TXSN and an input of the second buffer BUF2 and can include the filtering capacitance CFILT2 connected between the input of the second buffer BUF2 and the supply voltage VSUP-. It is also possible to use other suitable filter circuits, including, for example, the filter circuit with the first and second time-blanking circuits as discussed below with respect to the second embodiment shown in FIG. 5.

An adjustable-damping circuit can be connected to the terminals TXSP, TXSN. The adjustable-damping circuit can increase the amount of damping provided on the terminals TXSP, TXSN when the terminals TXSP, TXSN are low, which reduces the ringing on the secondary side. The adjustable-damping circuit can increase damping by increasing the amount of resistance connected to the terminals TXSP, TXSN. The adjustable-damping circuit can include a first damping circuit connected to the terminal TXSP and a second damping circuit connected to the terminal TXSN. The adjustable damping circuit can include switches MD1, MD2 that can each include three terminals, with one of the three terminals being a control terminal and the other two terminals providing a channel in which current can flow. The first damping circuit can include damping resistance RD1, switch MD1, and inverter INV4. The control terminal of switch MD1 can be connected to the terminal TXSN through the inverter INV4, and the other two terminals of switch MD1 can be connected across terminal TXSN and the voltage supply VSUP-. The second damping circuit can include damping resistance RD2, switch MD2, and inverter INV3. The control terminal of switch MD2 can be connected to the terminal TXSP through the inverter INV3, and the other two terminals of switch MC2 can be connected across terminal TXSP and the voltage supply VSUP-. Other possible configurations of the adjustable-damping circuit are also possible that increase the amount of damping provided on the terminals TXSP, TXSN when the terminals TXSP, TXSN are low to reduce ringing on the secondary side.

When line TXSP is low, switch MD2 turns on through inverter INV3, connecting damping resistance RD2 between terminal TXPP and supply voltage VSUP-. Accordingly, the voltage of terminal TXPP is pulled down to the voltage of the supply voltage VSUP-. When line TXSP is low and line TXSN is high, line TXSP is connected to supply voltage VSUP- through switch MC2 and through damping resistance RD2 and switch MD2. When line TXSP is high, switch MD2 turns off, and no additional power is dissipated through damping resistance RD2. Accordingly, damping resistance RD2 can have a relatively small resistance value.

When line TXSN is low, switch MD1 turns on through inverter INV4, connecting damping resistance RD1 between line TXSN and the supply voltage VSUP-. Accordingly, the voltage of terminal TXPN is pulled down to the voltage of the supply voltage VSUP-. When line TXSN is low and line TXSP is high, line TXSN is connected to supply voltage VSUP- through switch MC1 and through damping resistance RD1 and switch MD1. When line TXSN is high, switch MD1 turns off, and no additional power is dissipated through damping resistance RD1. Accordingly, damping resistance RD1 can have a relatively small resistance value.

Accordingly, by switching the switches MD1 and MD2, the overall damping resistance of the circuit can be dynamically changed by selectively enabling the ringing current to flow through the damping resistances RD1 and RD2. Since the damping resistances RD1 and RD2 have relatively small resistance values, the resonance effect caused by the leakage inductance Llk is greatly reduced, and common-mode noise immunity is improved by providing a constant or substantially constant connection, via a relatively low impedance, to a common ground.

The floating gate driver shown in FIG. 4 can also include filtering circuitry, shown as filtering resistances RFILT1 and RFILT2 and filtering capacitances CFILT1 and CFILT2. The filtering circuitry provides additional reduction or prevention of any residual resonance effects that remain. The filtering circuitry includes a first filter circuit including filtering resistance RFILT1 and filtering capacitance CFILT1 and a second filter circuit including filtering resistance RFILT2 and filtering capacitance CFILT2. Each of the first filter circuit and the second filter circuit provides a relatively short RC time constant to provide relatively fast switching to reduce a load on the energy and signal output from the lines TXSP and TXSN.

The circuit shown in FIG. 4 can use edge detection to detect signals for gate driving. Accordingly, pulses used to control gate driving can be relatively narrow, thereby enabling the transformer to have a relatively small size, for example, by including a relatively small core. In addition, the circuit shown in FIG. 4 can transfer both power and data using a single transformer, and with a wide frequency range. For example, the circuit shown in FIG. 4 may be used in range of zero Hz (i.e., DC power) to about 3 MHz.

Figure 5:
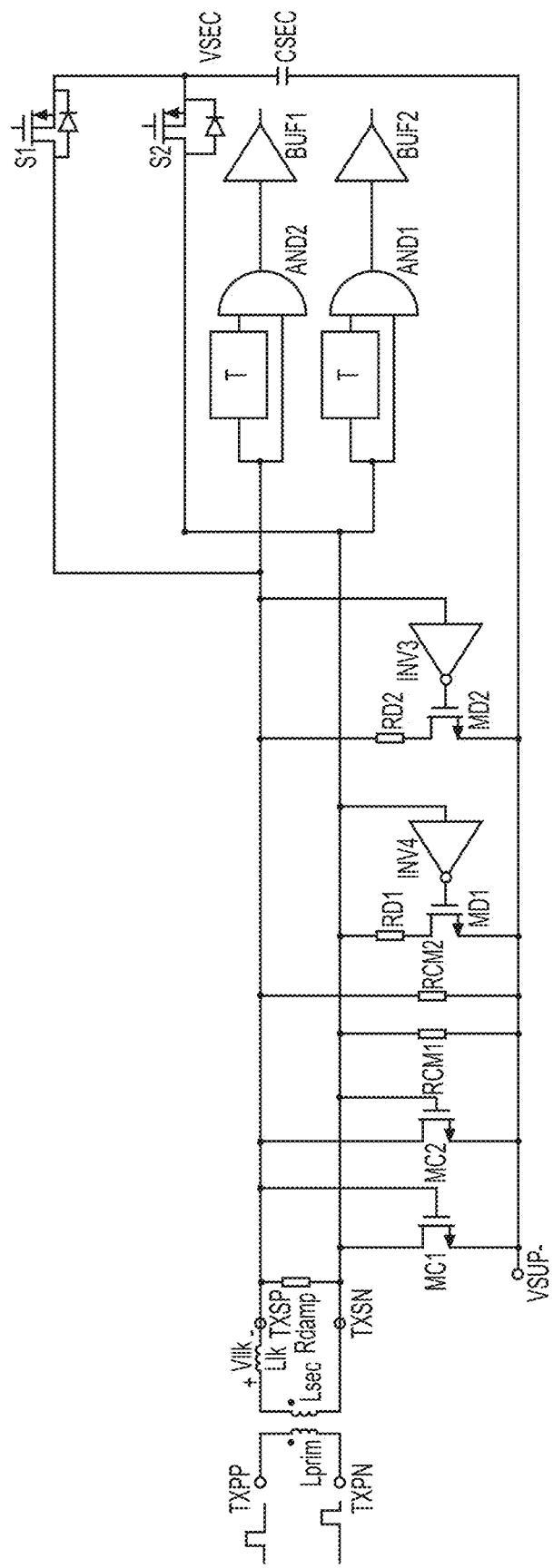
FIG. 5 is a circuit diagram of a floating gate driver according to a second preferred embodiment of the present invention.

FIG. 5 is a circuit diagram of a floating gate driver according to a second preferred embodiment of the present invention.

As shown in FIG. 5, a combination of delay cells T and AND-gates AND1 and AND2 may be included in place of the filtering circuitry (filtering resistances RFILT1 and RFILT2 and filtering capacitances CFILT1 and CFILT2) shown in FIG. 4. That is, the filtering circuitry shown in FIG. 4 is replaced by the delay cells T shown in FIG. 5. The filter circuit in FIG. 5 can be connected between the terminals TXSP, TXSN and the buffer circuit. The filter circuit can include a first time-blanking circuit connected to the first buffer BUF1 and a second time-blanking circuit connected to the second buffer BUF2. The first time-blanking circuit can include an AND-gate AND2 and a first delay cell T, and the second time-blanking circuit can include an AND-gate AND1 and a second delay cell T. In the first time-blanking circuit, one of the inputs of the AND-gate AND2 can be connected to the terminal TXSP, and the other input of the AND-gate AND2 can be connected to the terminal TXSP through the first delay cell T, and in the second time-blanking circuit, one of the inputs of the AND-gate AND1 can be connected to the terminal TXSN, and the other input of the AND-gate AND1 can be connected to the terminal TXSN through the second delay cell T.

Figure 2:
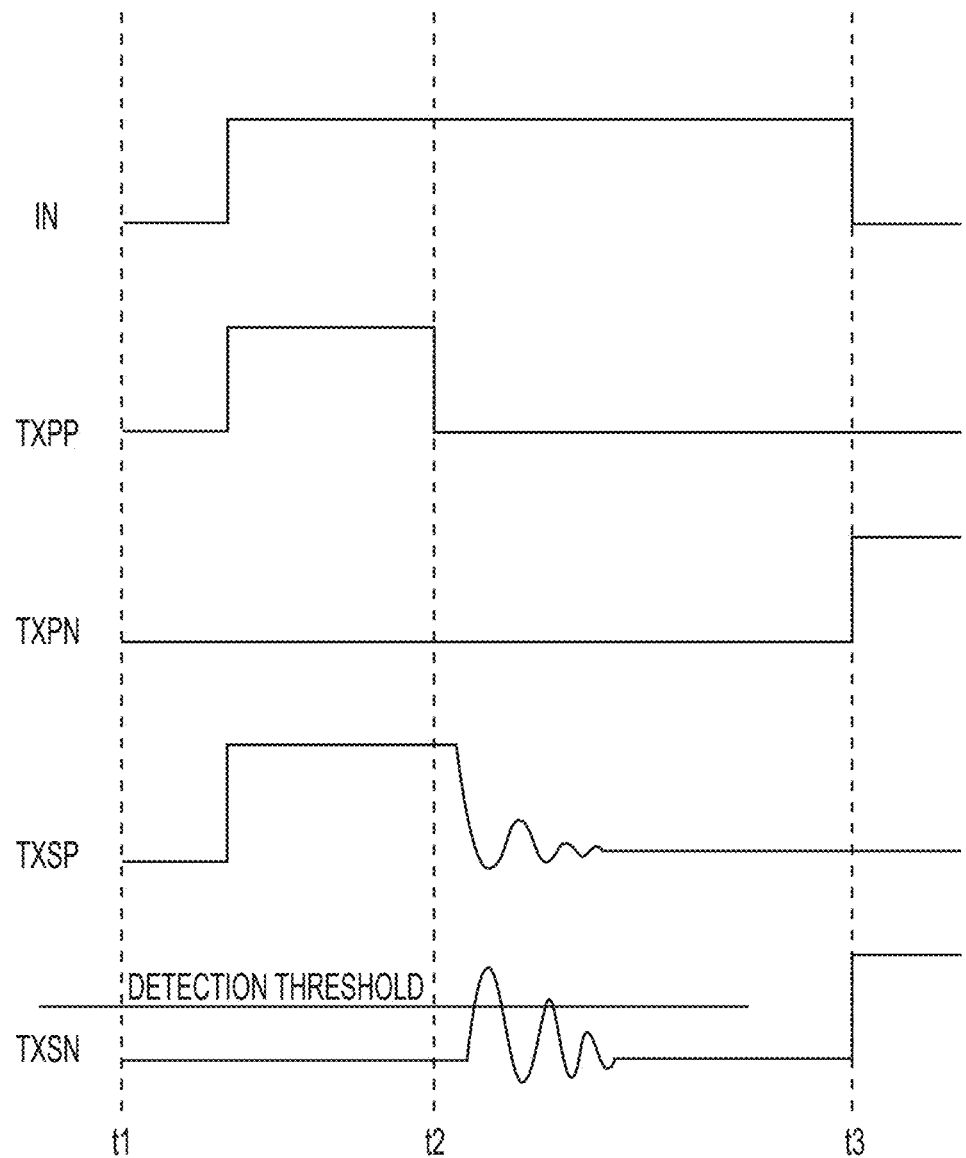
FIG. 2 shows voltage waveforms for the conventional floating gate driver shown in FIG. 1.

The combination of a first delay cell T and AND-gate AND1 provides a first time-blanking circuit that filters any signal that is above the detection level of the AND-gate AND1 for less than a first predetermined delay time τ of the first delay cell T. Similarly, the combination of a second delay cell T and AND-gate AND2 provides a second time-blanking circuit that filters any signal that is above the detection level of the AND-gate AND2 for less than a second predetermined delay time τ of the second delay cell T. Each of the first time-blanking circuit and the second time-blanking circuit provides a noise blanking function of noise from the lines TXSP and TXSN. For example, each of the first predetermined delay time τ and the second predetermined delay time τ can be equal to about one half of the period of the ringing signal on line TXSP or on line TXSN, as shown in FIG. 2.

Figure 3:
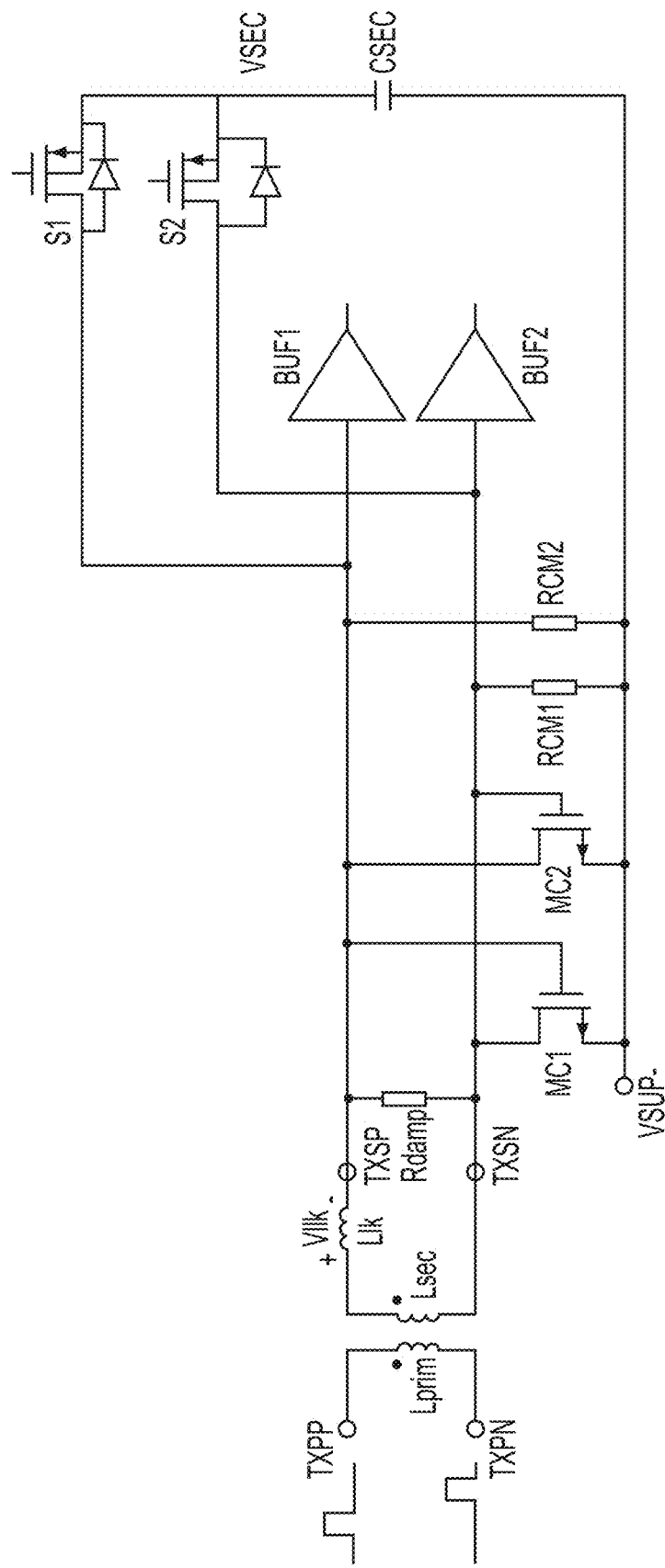
FIG. 3 is a circuit diagram of a modification to the conventional floating gate driver shown in FIG. 1.

Similar to the circuit shown in FIG. 3, a resistor Rdamp may be added between the lines TXSP and TXSN in the first preferred embodiment shown in FIG. 4 and in the second preferred embodiment shown in FIG. 5. The resistor Rdamp provides a constant damping resistance to dissipate energy that is built up in the leakage inductance Llk of the transformer, while the damping resistances RD1 and RD2 are selectively connected. Accordingly, the occurrence of ringing on the secondary side of the transformer is further reduced. The resistance of the resistor Rdamp may be between about 100Ω and about 10 kΩ.

For example, each of the switches MD1, MD2, MC1, MC1, S1, and S2 can be a metal-oxide-semiconductor field-effect transistor (MOSFET). However, other types of transistors, switches, relays, and the like may be used. If switches MD1, MD2, MC1, MC1, S1, and S2 are MOSFETs, then the control terminal can be a gate terminal, and the other two terminals can be source and drain terminals.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:
1. An isolated gate driver comprising:
   a transformer including a primary winding and a secondary winding;
   a synchronous rectifier electrically connected between the secondary winding and an output terminal of the isolated gate driver;
   a first switch including a first terminal electrically connected to a supply voltage;
   a second switch including a first terminal electrically connected to the supply voltage;
   a first damping resistance electrically connected between a first terminal of the secondary winding and a second terminal of the first switch;
   a second damping resistance electrically connected between a second terminal of the secondary winding and a second terminal of the second switch;
   a first inverter including an input electrically connected to the first terminal of the secondary winding and an output electrically connected to a gate terminal of the first switch; and a second inverter including an input electrically connected to the second terminal of the secondary winding and an output electrically connected to a gate terminal of the second switch.

2. The isolated gate driver according to claim 1, further comprising:
a first buffer electrically connected to the first terminal of the secondary winding; and
a second buffer electrically connected to the second terminal of the secondary winding.

3. The isolated gate driver according to claim 1, further comprising:
a first filter circuit that electrically connects the first terminal of the secondary winding to a first buffer; and
a second filter circuit that electrically connects the second terminal of the secondary winding to a second buffer.

4. The isolated gate driver according to claim 3, wherein:
the first filter circuit includes:
a first filtering resistance electrically connected in series between the first terminal of the secondary winding and an input of the first buffer; and
a first filtering capacitance electrically connected between the input of the first buffer and the supply voltage, and
the second filter circuit includes:
a second filtering resistance electrically connected in series between the second terminal of the secondary winding and an input of the second buffer; and
a second filtering capacitance electrically connected between the input of the second buffer and the supply voltage.

5. The isolated gate driver according to claim 3, wherein:
the first filter circuit includes a first delay cell, a first AND-gate, and the first buffer;
the first delay cell is electrically connected in series between the first terminal of the secondary winding and a first input of the first AND-gate;
a second input of the first AND-gate is electrically connected to the first terminal of the secondary winding;
an output of the first AND-gate is electrically connected to the first buffer;
the second filter circuit includes a second delay cell, a second AND-gate, and the second buffer;
the second delay cell is electrically connected in series between the second terminal of the secondary winding and a first input of the first AND-gate;
a second input of the second AND-gate is electrically connected to the second terminal of the secondary winding; and
an output of the second AND-gate is electrically connected to the second buffer.

6. An isolated gate driver comprising:
a transformer including a primary winding and a secondary winding;
a synchronous rectifier that provides power at a power output terminal of the isolated gate driver by rectifying high and low voltages provided by a first terminal of the secondary winding and high and low voltages provided by a second terminal of the secondary winding;
a buffer circuit that provides data signals at signal output terminals of the isolated gate driver based on the high and low voltages provided by the first terminal of the secondary winding and based on the high and low voltages provided by the second terminal of the secondary winding; and
an adjustable-damping circuit that increases an amount of damping provided on the first terminal of the secondary winding when the first terminal of the secondary winding provides the low voltage and that increases an amount of damping provided on the second terminal of the secondary winding when the second terminal of the secondary winding provides the low voltage.

7. The isolated gate driver circuit according to claim 6, wherein
the adjustable-damping circuit increases the amount of damping provided on the first terminal of the secondary winding by connecting the first terminal of the secondary winding to a supply voltage through a first damping resistance; and
the adjustable-damping circuit increases the amount of damping provided on the second terminal of the secondary winding by connecting the second terminal of the secondary winding to the supply voltage through a second damping resistance.

8. The isolated gate driver circuit according to claim 6, wherein the adjustable-damping circuit includes:
a first switch including a first terminal electrically connected to a supply voltage;
a second switch including a first terminal electrically connected to the supply voltage;
a first damping resistance electrically connected between the first terminal of the secondary winding and a second terminal of the first switch;
a second damping resistance electrically connected between the second terminal of the secondary winding and a second terminal of the second switch;
a first inverter including an input electrically connected to the first terminal of the secondary winding and an output electrically connected to a gate terminal of the first switch; and
a second inverter including an input electrically connected to the second terminal of the secondary winding and an output electrically connected to a gate terminal of the second switch.

9. The isolated gate driver according to claim 6, wherein the buffer circuit includes:
a first buffer electrically connected to the first terminal of the secondary winding; and
a second buffer electrically connected to the second terminal of the secondary winding.

10. The isolated gate driver according to claim 6, further comprising a filter circuit connected between the secondary winding and the buffer circuit.

11. The isolated gate driver according to claim 10, wherein the filter circuit includes:
a first filter circuit that electrically connects the first terminal of the secondary winding to a first buffer; and
a second filter circuit that electrically connects the second terminal of the secondary winding to a second buffer.

12. The isolated gate driver according to claim 11, wherein:
the first filter circuit includes:
a first filtering resistance electrically connected in series between the first terminal of the secondary winding and an input of the first buffer; and
a first filtering capacitance electrically connected between the input of the first buffer and the supply voltage, and
the second filter circuit includes:
a second filtering resistance electrically connected in series between the second terminal of the secondary winding and an input of the second buffer; and a second filtering capacitance electrically connected between the input of the second buffer and the supply voltage.

13. The isolated gate driver according to claim 11, wherein:
the first filter circuit includes a first delay cell, a first AND-gate, and the first buffer;
the first delay cell is electrically connected in series between the first terminal of the secondary winding and a first input of the first AND-gate;
a second input of the first AND-gate is electrically connected to the first terminal of the secondary winding;
an output of the first AND-gate is electrically connected to the first buffer;
the second filter circuit includes a second delay cell, a second AND-gate, and the second buffer;
the second delay cell is electrically connected in series between the second terminal of the secondary winding and a first input of the first AND-gate;
a second input of the second AND-gate is electrically connected to the second terminal of the secondary winding; and
an output of the second AND-gate is electrically connected to the second buffer.

* * * * *